United States Patent [19]

Devlin et al.

[11] Patent Number: 5,081,432
[45] Date of Patent: Jan. 14, 1992

[54] VARIABLE BI-PHASE MODULATOR CIRCUITS AND VARIABLE RESISTORS FOR MICROWAVE SIGNALS

[75] Inventors: Liam M. Devlin, Horley; Brian J. Minnis, Crawley, both of England

[73] Assignee: U.S. Philips Corp., New York, N.Y.

[21] Appl. No.: 626,079

[22] Filed: Dec. 11, 1990

[30] Foreign Application Priority Data

Dec. 15, 1989 [GB] United Kingdom ............... 8928412

[51] Int. Cl.[5] .................. H03C 3/10; H03K 7/00; H01P 9/00
[52] U.S. Cl. .................. 332/103; 332/105; 333/164
[58] Field of Search ............ 332/103, 105; 307/571, 307/582; 375/55, 67; 333/164

[56] References Cited
U.S. PATENT DOCUMENTS 4,565,980  1/1986  Ashida .................. 332/105

Primary Examiner—David Mis
Attorney, Agent, or Firm—Steven R. Biren

[57] ABSTRACT

A variable bi-phase modulator circuit for microwave signals includes a quadrature power divider (1) having signal input and output ports (2 and 3) and two control ports (4 and 5), and two variable resistors each having an input port (11). Each of the two variable resistors includes first and second microwave field-effect transistors (F1 and F2), the drains of which are coupled together via an intermediate resistor (R). These resistors can be formed using microwave monolithic integrated circuit technology and can have very good impedance characteristics. The input port (11) of the variable resistor has a connection to the intermediate resistor (R) and to the drain of the first transistor (F2). Each transistor is connected with zero dc bias between its source and drain and has a channel resistance which changes with change in gate voltage (VG1, VG2). A shunt stub (L1, L2) is connected to the drain of each transistor (F1, F2) to at least partially compensate at the frequency of operation of the transistor for the source to drain capacitance and for shifts in reference plane due to changes in the gate voltage of each transistor.

10 Claims, 2 Drawing Sheets

VARIABLE BI-PHASE MODULATOR CIRCUITS AND VARIABLE RESISTORS FOR MICROWAVE SIGNALS

BACKGROUND OF THE INVENTION

This invention relates to variable bi-phase modulator circuits for microwave signals, particularly but not exclusively to such circuits suitable for use in, for example, reflected power cancellers for frequency modulated continuous-wave (FMCW) radar, or for use in transmit/receive modules for phased-array radar. The invention also relates to variable resistors, particularly but not exclusively for use in such circuits.

UK Patent Application GB 88.28561.4 published as GB-A-2 226 204 on June 20th 1990, describes, in a reflected power canceller, a bi-phase modulator circuit (FIG. 5) comprising a quadrature power divider (62) which has signal input and output ports (72 and 74) and two control ports (68 and 70), and comprises two variable resistors (64 and 66) each having an input port connected to the respective control port (68 and 70). The whole contents of U.S. Pat. No. 4,970,519, the U.S.A. counterpart of GB-A-2 226 204 are hereby incorporated herein as reference material. It should be noted that (although of earlier priority date than the present application) GB 88.28561.4 is not a prior publication.

In the form disclosed in GB-A-2 226 204, each of the two variable resistors is a PIN diode which is partially forward-biased. These PIN diodes form good variable resistors but such diodes cannot be readily fabricated in presently used microwave monolithic integrated circuit technologies.

SUMMARY OF THE INVENTION

According to one aspect of the present invention there is provided a variable bi-phase modulator circuit for microwave signals comprising a quadrature power divider having signal input and output ports and two control ports, and comprising two variable resistors each having an input port connected to the respective control port, characterised in that each of the two variable resistors comprises first and second microwave field-effect transistors the drains of which are coupled together via an intermediate resistor, the input port of the variable resistor comprising a connection to the intermediate resistor and to the drain of the first transistor, each transistor being connected with zero dc bias between its source and drain and having a channel resistance which changes with change in gate voltage, and in that a shunt stub is connected to the drain of each transistor to at least partially compensate at the frequency of operation of the transistor for the source to drain capacitance and for shifts in reference plane due to changes in the gate voltage of each transistor.

Each variable resistor constructed in this manner as two zero-biased tuned field-effect transistors coupled by an intermediate resistor can be formed using microwave monolithic integrated circuit technologies so that the whole bi-phase modulator circuit may be fabricated in this manner on a single substrate. The resistance value can be varied by varying the gate voltages applied to the transistors. Furthermore, as will be described in more detail hereinafter, the variable resistors formed in this manner with suitably-tuned transistors can have very good characteristics and can permit performance enhancement of variable bi-phase modulators in relation to their phase noise performance, bandwidth, power handling ability, dynamic range and phase accuracy. In general a vector modulator which uses these variable bi-phase modulators will have lower amplitude and phase errors, and this has important systems consequences. When used as a reflected power canceller for FMCW radar, the receiver sensitivity will be increased. In phased array radar, sidelobe levels are reduced and the direction finding accuracy is improved.

The quadrature power divider may be formed conveniently as a Lange coupler, for example, and propagation losses may occur in the power divider which affect the phase characteristics of the control signal from the control ports. In accordance with the present invention, the respective control port is preferably connected to the intermediate resistor of the transistor pair via a length of transmission line which compensates at least partly for the effect of these propagation losses on the phase characteristics.

It may be noted that it is already known from the paper entitled "GaAs Monolithic Wideband (2–18 GHz) Variable Attenuators by Y. Tajima et al on page 479 to 481 of IEEE MTT-S Digest 1982 to use a zero-biased field-effect transistor to form a variable transmission attenuator. With zero drain to source bias, the depletion region of the field-effect transistor is symmetrical and its channel resistance then varies with applied gate voltage from a very low value to a very high value. Three such transistors are connected in a T or a $\pi$ shape network to form a transmission attenuator having a good transmission match at input and output ports. The whole contents of the Tajima paper are hereby incorporated herein as reference material.

However, as will be described hereinafter with reference to a Smith chart (FIG. 5), the variable impedance obtained with just one tuned zero-biased field-effect transistor can have a large imaginary component which degrades the impedance match, thus decreasing the dynamic range of attenuation and introducing phase errors. This is especially significant for (one-port) reflection attenuators. By replacing such a single transistor with an arrangement of paired transistors and an intermediate resistor in accordance with the present invention, the transistor attenuator arrangement can be tuned closer to the ideal, as will be described hereinafter with reference to an example in another Smith chart (FIG. 7).

Thus, according to another aspect of the present invention, there is provided a variable resistor in a microwave circuit, the resistor comprising a microwave field-effect transistor connected with zero dc bias between its source and drain and having a channel resistance which changes with change in gate voltage, characterized in that the variable resistor comprises first and second of said transistors the drains of which are coupled together via an intermediate resistor, in that an input port of the variable resistor comprises a connection to the intermediate resistor and to the drain of the first transistor, and in that a shunt stub is connected to the drain of each transistor to at least partially compensate at the frequency of operation of the transistor for the source to drain capacitance and for shifts in reference plane due to changes in the gate voltage of each transistor.

Such a variable resistor in accordance with the present invention may be designed for use as a reflection attenuator in a variable bi-phase modulator circuit in accordance with the invention, but such resistors may also be designed for use in other microwave circuits, for example as transmission attenuators, phase shifters and power switches.

BRIEF DESCRIPTION OF THE DRAWING

These and other features in accordance with the invention are illustrated, by way of example, in specific embodiments of the invention now to be described with reference to the accompanying drawings, in which.

DESCRIPTION OF THE PREFERRED EMBODIMENTS

Figure 1:
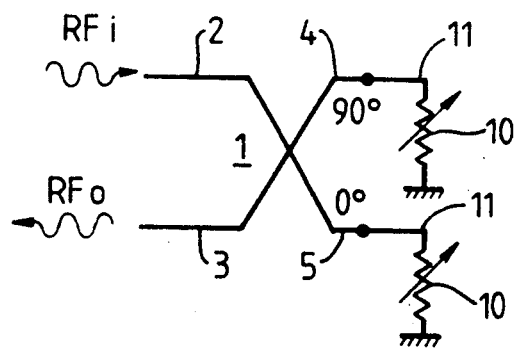
FIG. 1 is a schematic circuit representation of one form of variable bi-phase modulator.

Ideally a variable bi-phase modulator with an RF input (RFi) of $e^{j\theta}$ should have an output (RFo) of $Ae^{j\theta}$, where A is continuously variable between $+1$ and $-1$ and where $\theta$ is a constant. FIG. 1 shows a circuit realizing this variable bi-phase modulator function and comprising a quadrature power divider 1 having signal input and output ports 2 and 3 respectively and two control ports 4 and 5. The modulator circuit also comprises two variable resistors 10 each having an input port 11 connected as control elements to the respective control ports 4 and 5 of the power divider 1. The quadrature power divider 1 is conveniently realized as a Lange coupler. However, a most important factor in obtaining a good quality modulator is for each load 10 to be a nearly pure variable resistance. The use of PIN diodes to form the loads 10 is not readily achievable in microwave monolithic integrated circuit technology, and so tuned unpowered microwave field-effect transistors such as MESFETs (metal Schottky-gate field-effect transistors) F1 and F2 are used instead, together with a resistor R connected in a configuration in accordance with the present invention.

Figure 2:
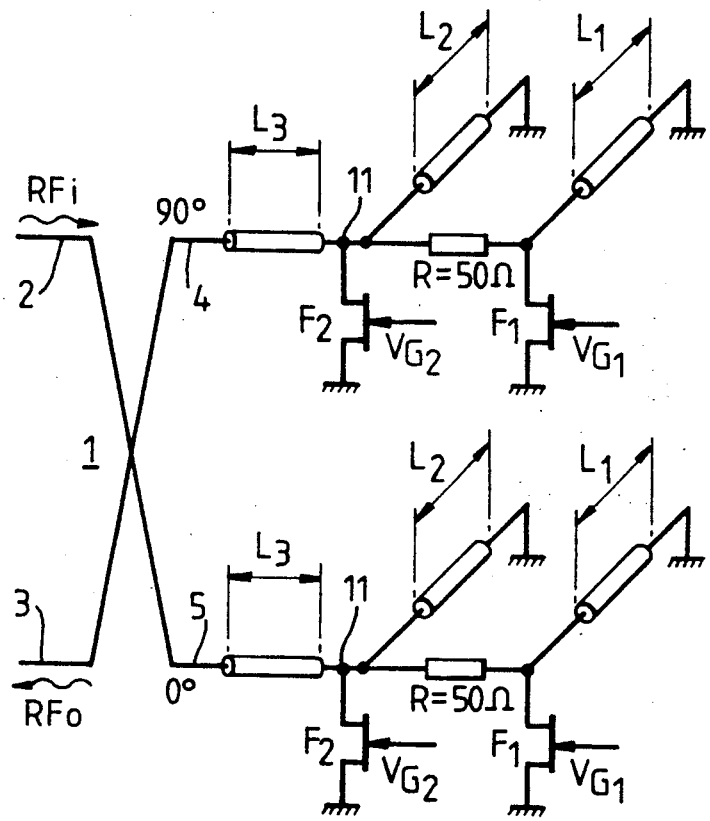
FIG. 2 is a more detailed schematic representation of this form of modulator circuit having variable resistors in accordance with the present invention.
Figure 6:
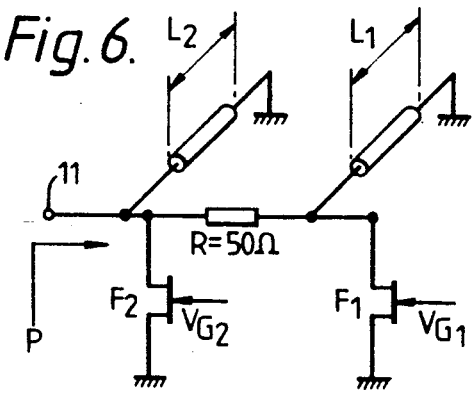
FIG. 6 is a schematic circuit representation of a variable resistor in accordance with the present invention.

Thus, as illustrated in the examples of FIGS. 2 and 6, each variable resistor 10 comprises first and second microwave field-effect transistors F1 and F2 the drains of which are coupled together via an intermediate resistor R. The input port 11 of the variable resistor comprises a connection to the intermediate resistor R and to the drain of the first transistor F2. Each transistor F1 and F2 is connected with zero dc bias between its source and drain and has a channel resistance which changes with change in gate voltage VG1 and VG2. A shunt stub L1 and L2 is connected to the drain of each respective transistor F1 and F2 to at least partially compensate at the frequency of operation of the transistor for the source to drain capacitance and for shifts in reference plane due to changes in the gate voltage VG1 and VG2 of each transistor F1 and F2.

With zero drain to source bias, the depletion region below the gate of the FET is symmetrical and the resistance then varies with applied gate voltage VG from a very low value for VG of 0 volts to a very high value for VG greater than the pinch-off voltage (for example, about $-4$ volts).

Figure 4:
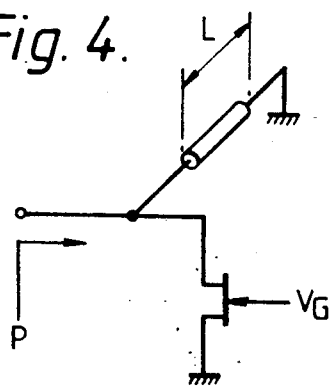
FIG. 4 is a schematic circuit representation of a single tuned zero-biased FET as a variable resistor.

One main difficulty with using an FET as a switch is the presence of a large drain to source capacitance which varies with gate voltage VG, even though this range of variation is much less than that for the resistance. Since this capacitance is essentially a low resistance path at high frequencies, it is tuned out in order to create a variable resistive load, and this can be achieved by using a short-circuit shunt stub L. The transmission line stub L forms a shunt inductance to ground as illustrated in FIG. 4. The length of the stub L is less than a quarter wavelength and is optimized to give a 180° phase shift in $\rho$ (the reflection coefficient for voltage), between the on and off states of the FET. The value of $\rho$ is given by:

$$\rho = V1/V0$$

which also corresponds to:

$$\rho = (ZL - Z0)/(ZL + Z0)$$

where V0 is the incident voltage and V1 is the voltage reflected from the load formed by the FET, both voltages being measured at a reference plane along a transmission line terminated by the FET load, and where Z0 is the characteristic impedance of the line ZL is the load impedance. It will be assumed that Z0=50 ohms, as is the situation for most circuits of interest.

Figure 5:
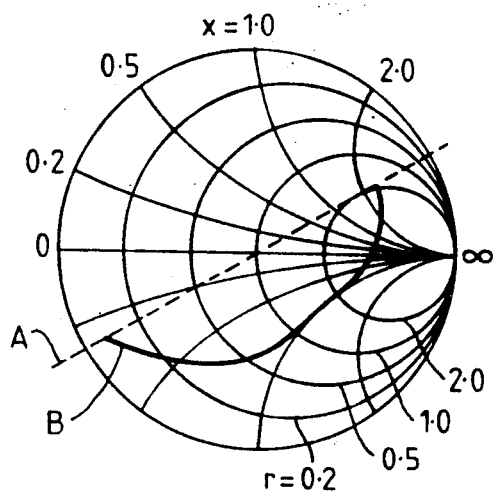
FIG. 5 is a Smith chart representation of the impedance of this variable resistor of FIG. 4.
Figure 7:
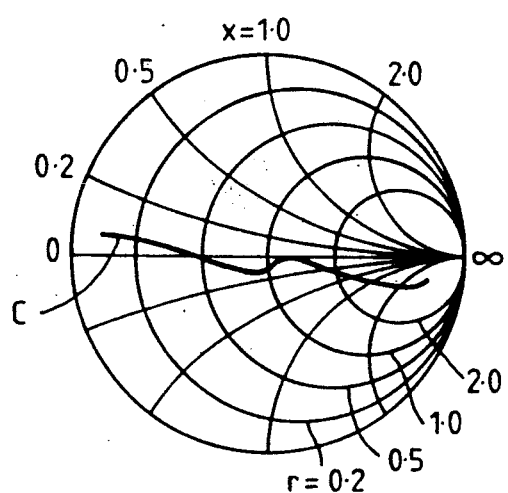
FIG. 7 is a Smith chart representation of the impedance of this variable resistor of FIG. 6.

In FIGS. 5 and 7, reflection coefficients $\rho$ are plotted on a Smith chart with coordinates of normalized resistance (r=R/Z0, for Z0=50 ohms) corresponding to the circles, and of normalized reactance (x=X/Z0, for Z0=50 ohms) corresponding to the arcs orthogonal to the circles. In this situation, the value of $\rho$ becomes:

$$\rho = (z-1)/(z+1)$$

where $z = (r + jx)$.

A pure resistance has a locus of $\rho$ which, when plotted on a Smith chart, is a horizontal straight line passing through the center point (Z=50 ohms, r=1, x=0) of FIGS. 5 and 7. Any straight line (e.g. line A) across the Smith chart passing through the center point represents a reflection coefficient ($\rho$) which has a 180° phase difference between the opposite halves of the chart and has a magnitude which varies between 0 and 1 in each half. This satisfies the requirements of a biphase reflection attenuator. With a single tuned zero-biased FET as in FIG. 4 the locus of $\rho$ with applied control voltage VG deviates considerably from a straight line through the center, as is shown by the curve B in FIG. 5. In this case, the impedance has a large imaginary component in the center region of the chart between curve B and line A; this degrades the best match case, thus decreasing the dynamic range of attenuation and introducing phase errors. Phase errors can be thought of as unwanted shifts in reference plane.

By replacing the single tuned FET with two zero-biased tuned FETs F1 and F2 of appropriate gate width and a resistor R as shown in FIG. 6, the length of the short-circuit tuning stubs L1 and L2 can be selected so as to force the locus of $\rho$ to be closer to the ideal. A particular example is illustrated by curve C in FIG. 7, for which it can be seen that the locus of $\rho$ with applied control voltages VG1 and VG2 passes from a near short circuit (approaching $r=0$, $\theta=180°$, $x=0$) to a near open circuit (approaching $r=\infty$, $\theta=0°$, $x=0$) through a point close to the centre ($r=1$, $x=0$) of the chart in a near straight line. This is a much improved variable resistive load, compared with the single tuned FET in FIG. 5. Except for allowing the desired 180° reversal in phase from short circuit to open circuit, the tuning stubs L1 and L2 connected to the drain of each transistor F1 and F2 compensate for most of the variations in phase characteristics due to the changes in source to drain capacitance with gate voltage VG1 and VG2. Thus, when the load terminations 10 are a low resistance, signals are strongly reflected with a phase inversion; when they are high in resistance, the signals are strongly reflected with no phase inversion; and when the resistance approach Z0 (50 ohms, i.e. $r=1$) the reflections tend to zero.

Figure 3:
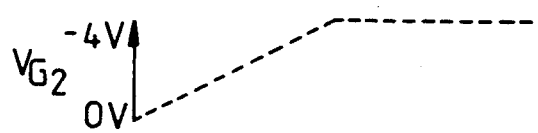
FIG. 3 is a pictorial representation of the effect of changes in gate voltages VG1 and VG2 on the impedance of the variable resistors in accordance with the invention.
Figure 3:

The two gate voltages VG1 and VG2 control the variable load as follows: With VG1=VG2=0 volts, both FETs are in the low resistance state ("on"). When VG2 is varied from 0 volts to above the pinch-off voltage (e.g. −4 volts), the load changes from a near short circuit ($r=0$) to a good match. If VG1 is then varied from 0 volts to above the pinch-off voltage (e.g. −4 volts), the load changes further from a good match to a near open circuit ($r=\infty$). FIG. 3 gives a pictorial representation of this adjustment.

The FET F2 preferably has a larger gate width (wider channel) than FET F1, since it must handle nearly all of the short circuit current. A smaller gate width (narrower channel) for F1 also provides a better open circuit, with minimal degradation of the short circuit.

The superior performance of this FIG. 6 circuit (as compared with that of FIG. 4) greatly out-weights a slight disadvantage of requiring two control voltages. However with appropriate control circuits these could be derived from one master control voltage.

As described with reference to FIGS. 1 and 2, the initial quadrature power split is conveniently accomplished using a Lange coupler. Real Lange couplers have propagation losses associated with both the conductors and the dielectric. If the coupled and through ports 4 and 5 respectively were terminated in open circuits, total reflection would take place and the signal would appear at the isolated port 3, slightly attenuated due to the coupler losses. If the coupled and through ports 4 and 5 were terminated in short circuits, total reflection would again take place but with an accompanying 180° phase shift. The signal now appearing at the isolated port 3 would not be, however, of the same magnitude as with open circuit terminations but would be attenuated by a further 1 dB. Also the phase difference would not be 180° but approximately 170°. The reason for this is that in the short circuit case current flow in the coupler is a maximum and conductor losses predominate. In the open circuit case, voltage is a maximum and dielectric losses predominate. Conductor losses have a more pronounced effect on overall propagation losses than dielectric losses.

Including a suitable length of transmission line L3 between the ports 4 and 11 and between the ports 5 and 11 of the variable loads 10 and the coupler 1 compensates at least partially for the effect of the coupler losses on phase. While the length of the line L3, before the variable resistive load 10, corrects phase errors due to coupler losses, it does not correct the slight difference that would be observed between the amplitudes of $\rho$ if the open and short circuits were perfect. However, in the real variable load, the FETs present a better quality short circuit than open circuit, and this almost completely eliminates the magnitude error. A near 180° phase difference is obtained over the whole dynamic range.

Figure 8:
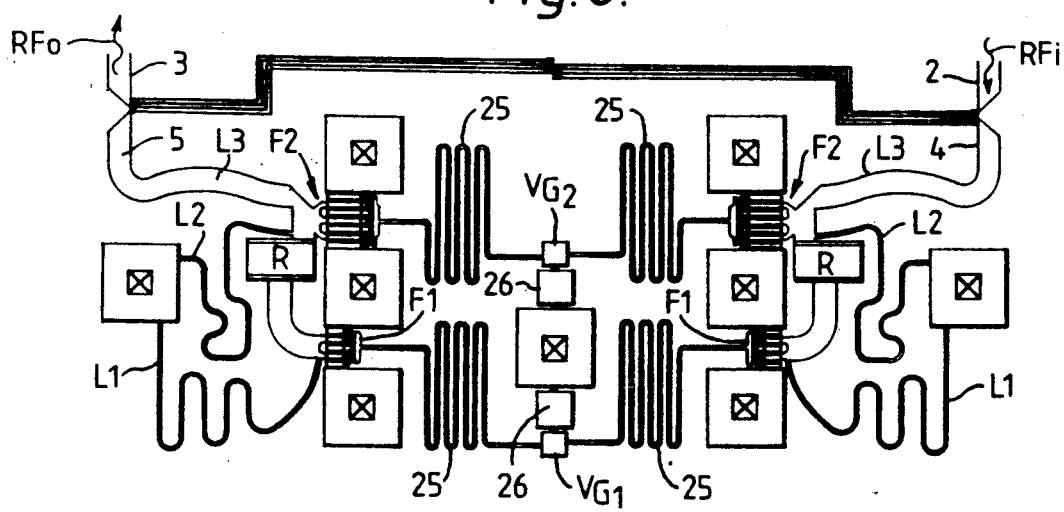
FIG. 8 is a top view of one embodiment of the variable bi-phase modulator of FIG. 2 formed as a microwave monolithic integrated circuit.

The whole bi-phase modulator including these variable resistors 10 can be formed using microwave monolithic integrated circuit technology. FIG. 8 illustrates one possible example of the layout of such a circuit on a gallium-arsenide substrate, in which the various components are labelled as in FIG. 2. With the FIG. 6 circuit configuration for the variable resistors 10, a very compact layout of the variable bi-phase modulator can be obtained, as compared with a variable bi-phase modulator formed of a Lange coupler (the through and coupled ports of which are terminated in switches to provide the optional 180° phase shift) followed by a transmissive attenuator to adjust the magnitude. The squares containing diagonal crosses (X) indicate vias through the substrate to a bottom ground-plane so grounding these parts of the circuit, e.g. the short-circuit shunt stubs L1 and L2 and the sources of the FETs F1 and F2. The control voltages VG1 and VG2 are applied to contact-pads which are connected to the gates of F1 and F2 by bias lines 25 and which are connected to ground through capacitors 26. Transistors F1 and F2 of conventional form with interdigital source and drain are illustrated.

A pair of the variable bi-phase modulators (each with a Lange coupler 1 and a pair of variable loads 10) of FIGS. 2 and 8 may, for example, be connected in parallel arms between an input quadrature power divider (e.g. a Lange coupler) and an output power combiner (e.g. a Wilkinson combiner) to form an I-Q vector modulator. In this I-Q vector modulator, the input signal is split into two orthogonal components by the input Lange coupler, these two components (I and Q vectors) are adjusted in amplitude by the pair of variable bi-phase modulators, and these I and Q vectors from the pair of modulators are then added in the Wilkinson combiner to give the final output signal. The vector modulator may be formed as one monolithic integrated circuit. Such an I-Q vector modulator may, for example, be used to provide the modulator unit 28 illustrated in FIG. 4 of GB 8828561.4 in a reflected power canceller of a CW radar.

As well as ease of manufacture in microwave monolithic integrated circuit technology, the variable resistors 10 formed in this manner with suitably-tuned transistors F1 and F2 and resistor R can have very good characteristics and can permit performance enhancement of variable bi-phase modulators in relation to their phase noise performance, bandwidth, power handling ability, dynamic range and phase accuracy. In general a vector modulator which uses these variable bi-phase modulators will have lower amplitude and phase errors. This has important systems consequences. When used as a reflected power canceller for FMCW radar, the reduction in phase errors improves the suppression of unwanted reflections and so the receiver sensitivity will be increased. In phased array radar, sidelobe levels are reduced and the direction finding accuracy is improved.

Instead of being designed as a one-port reflection attenuator for use in a variable bi-phase modulator circuit, such resistors 10 may also be designed for use in other microwave circuits in accordance with the invention and with two ports, for example transmission attenuators, phase shifters and power switches. Thus, for example a transmission attenuator may be designed with a variable resistor 10 having an input port 11 and an output port at the connected sources of F1 and F2 of FIG. 6. Three such resistors 10 may be connected in a T or a $\pi$ network similar to that described in said Tajima paper, except that each of the three resistors comprises F1,F2,R,L1 and L2, i.e. the T or $\pi$ network comprises a total of six FETs and three resistors.

From reading the present disclosure, other variations will be apparent to persons skilled in the art. Such variations may involve other features which are already known in the design, manufacture and use of systems, circuits and components parts of variable bi-phase modulators and other microwave circuits comprising variable resistors, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

We claim:

1. A variable resistor in a microwave circuit, the resistor comprising a microwave field-effect transistor connected with zero dc bias between its source and drain and having a channel resistance which changes with change in gate voltage, characterized in that the variable resistor comprises first and second of said transistors, the drains of which are coupled together via an intermediate resistor, in that an input port of the variable resistor comprises a connection to the intermediate resistor and to the drain of the first transistor, and in that a shunt stub is connected to the drain of each transistor to at least partially compensate at the frequency of operation of the transistor for the source to drain capacitance and for shifts in reference plane due to changes in the gate voltage of each transistor.

2. A variable resistor as claimed in claim 1, further characterized in that the first transistor has a wider channel than the second transistor.

3. A variable bi-phase modulator circuit for microwave signals comprising a quadrature power divider having signal input and output ports and two control ports, and comprising two variable resistors each having an input port connected to the respective control port, characterized in that each of the two variable resistors comprises first and second microwave field-effect transistors, the drains of which are coupled together via an intermediate resistor, the input port of the variable resistor comprising a connection to the intermediate resistor and to the drain of the first transistor, each transistor being connected with zero dc bias between its source and drain and having a channel resistance which changes with change in gate voltage, and in that a shunt stub is connected to the drain of each transistor to at least partially compensate at the frequency of operation of the transistor for the source to drain capacitance and for shifts in reference plane due to changes in the gate voltage of each transistor.

4. A bi-phase modulator circuit as claimed in claim 3, further characterized in that propagation losses occur in the power divider, and the respective control port is connected to the intermediate resistor via a length of transmission line which compensates at least partially for the effect of these propagation losses on the phase characteristics of the control signal from the control port.

5. A bi-phase modulator circuit as claimed in claim 4, further characterized by being formed as a microwave monolithic integrated circuit.

6. A bi-phase modulator as claimed in claim 5, further characterized in that the first transistor has a wider channel than the second transistor.

7. A bi-phase modulator as claimed in claim 4, further characterized in that the first transistor has a wider channel than the second transistor.

8. A bi-phase modulator as claimed in claim 3, further characterized in that the first transistor has a wider channel than the second transistor.

9. A bi-phase modulator circuit a claimed in claim 3, further characterized by being formed as a microwave monolithic integrated circuit.

10. A bi-phase modulator as claimed in claim 9, further characterized in that the first transistor has a wider channel than the second transistor.

* * * * *